United States Patent
Hsu et al.

(10) Patent No.: US 7,719,358 B2
(45) Date of Patent: May 18, 2010

(54) LOW FREQUENCY ANALOG CIRCUIT AND DESIGN METHOD THEREOF

(75) Inventors: Yu-Chun Hsu, Dongshih Township, Taichung County (TW); Lu-Po Liao, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 108 days.

(21) Appl. No.: 11/874,929

(22) Filed: Oct. 19, 2007

(65) Prior Publication Data

US 2008/0258816 A1 Oct. 23, 2008

Related U.S. Application Data

(60) Provisional application No. 60/866,609, filed on Nov. 21, 2006.

(51) Int. Cl.
*H03F 3/45* (2006.01)
(52) U.S. Cl. .................. 330/253; 330/260; 330/261
(58) Field of Classification Search ............. 330/253, 330/257, 260, 261, 277
See application file for complete search history.

(56) References Cited

U.S. PATENT DOCUMENTS

| | | | |
|---|---|---|---|
| 5,589,799 A | | 12/1996 | Madaffari et al. |
| 5,805,021 A | * | 9/1998 | Brehmer .................. 330/255 |
| 5,808,513 A | * | 9/1998 | Archer .................... 330/253 |
| 6,107,883 A | * | 8/2000 | Xu ......................... 330/255 |
| 6,531,921 B2 | * | 3/2003 | Horie ...................... 330/255 |
| 6,844,782 B2 | * | 1/2005 | Otaka ...................... 330/254 |
| 7,039,202 B1 | | 5/2006 | Takeuchi |
| 7,113,042 B2 | * | 9/2006 | Richard et al. ............. 330/253 |

FOREIGN PATENT DOCUMENTS

CN 1859015 11/2006

OTHER PUBLICATIONS

"1st Office Action of Chinese counterpart application", issued on Aug. 28, 2009, p. 1-p. 5.

* cited by examiner

*Primary Examiner*—Khanh V Nguyen
(74) *Attorney, Agent, or Firm*—Jianq Chyun IP Office (57) ABSTRACT

A low frequency analog circuit and a method for designing the same are provided. In a low frequency analog circuit according to the present invention, a part of MOS transistors employed in the circuit are operated at a weak inversion region.

23 Claims, 5 Drawing Sheets

LOW FREQUENCY ANALOG CIRCUIT AND DESIGN METHOD THEREOF

CROSS-REFERENCE TO RELATED APPLICATION

This application claims the priority benefit of U.S.A. provisional application Ser. No. 60/866,609, filed on Nov. 21, 2006, all disclosures are incorporated herein by reference.

BACKGROUND OF THE INVENTION

1. Field of the Invention

The present invention generally relates to a low frequency analog circuit and a design method thereof, and more particularly, to a method of operating at least one MOS transistor of a circuit in a weak inversion region and a low frequency analog circuit thereof.

2. Description of Related Art

Low frequency analog circuits which are normally operated under a frequency of 1 MHz are often used for amplifying signals, e.g., a post-amplifier of a microphone. Conventional low frequency analog circuits are often fabricated as integrated circuit (IC) chips, and MOS transistors of the ICs are often designed for operating in strong inversion regions thereof, e.g., an NMOS (N-type metal-oxide-semiconductor) transistor operating under a condition of "$V_{gs}-V_{th}>0$" for regular operation of the circuit. However, in this manner, performance of the circuit is also limited by the specific condition. For example, a current flowing through an NMOS transistor operating under this condition at a saturation status can be defined as equation (1), that is:

$$I_D = (1/2)\mu_n C_{ox}(V_{gs}-V_{th})^2 \quad (1)$$

wherein $\mu_n$ represents an electron mobility; $C_{ox}$ represents an oxidation capacitance; $V_{gs}$ represents a voltage between a gate electrode and a source electrode of the transistor, and $V_{th}$ represents a threshold voltage of the transistor. Therefore, transconductance (2) can be obtained as indicated below.

$$g_m = \sqrt{2K(W/L)I_D}, \quad (2)$$

wherein W/L represents an aspect ratio on the MOS transistor, in which W and L represent a width and a length of the MOS transistor respectively. It can be known from the equation (2) that the transconductance $g_m$ is related to the current. When the current is greater the transconductance is also greater. However, in further considering a general noise equivalent equation, e.g., equation (3):

$$V_i^2/\Delta f = (8/3)kT(1/g_m) + K_f/WLC_{ox}f \quad (3)$$

wherein f represents frequency, it can be concluded that the greater the transconductance is, the lower the noise would be, which is also known as a higher signal noise ratio (SNR). As such, efforts towards higher SNR and lower power consumption in designing a low frequency analog circuit chip are contradicted to each other.

SUMMARY OF THE INVENTION

Accordingly, the present invention is directed to a method for designing a low frequency analog circuit, in which a low frequency analog circuit is provided and then at least one MOS transistor of the low frequency analog circuit is operated at a weak inversion region.

The present invention provides a low frequency analog circuit. The low frequency analog circuit includes a resistance conversion stage, and an amplifying circuit. The resistance conversion stage is adapted for receiving an input signal, and transmitting the input signal from a higher resistance to a lower resistance, and obtaining a resistance conversion signal. The amplifying circuit is adapted for receiving and amplifying the resistance conversion signal. The amplifying circuit includes at least one MOS transistor operated at a weak inversion region.

The present invention also provides a low frequency analog circuit. The low frequency analog circuit includes a first PMOS transistor, a second PMOS transistor, a third PMOS transistor, a first current mirroring device, a first NMOS transistor, a second NMOS transistor, a third NMOS transistor and a fourth NMOS transistor. The first PMOS transistor comprises a source electrode coupled to a power source voltage, and a gate electrode coupled to a first bias voltage. The second PMOS transistor comprises a source electrode coupled to a drain electrode of the first PMOS transistor, and a gate electrode for receiving a first input signal. The second NMOS transistor is operated at a weak inversion region. The third PMOS transistor comprises a source electrode coupled to the drain electrode of the first PMOS transistor, a gate electrode for receiving a second input signal. The second input signal is a differential signal of the first input signal, and the third PMOS transistor is operated at the weak inversion region. The first current mirroring device includes a first terminal, a second terminal, a third terminal and a fourth terminal. The first terminal and the second terminal of the first current mirroring device are coupled to the power source voltage. Current values of the second terminal and the fourth terminal are determined according to currents flowing through the first terminal and the third terminal of the first current mirroring device. The first NMOS transistor has a drain electrode coupled to the third terminal of the current mirroring device, and a gate electrode coupled to a second bias voltage, and a source electrode coupled to a drain electrode of the second PMOS transistor. The second NMOS transistor has a drain electrode coupled to the fourth terminal of the current mirroring device and served as an output terminal of the low frequency analog circuit, a gate electrode for receiving the second bias voltage and a source electrode coupled to the drain electrode of the third PMOS transistor. The third NMOS transistor comprises a drain electrode coupled to the drain electrode of the second PMOS transistor, a gate electrode receiving a third bias voltage and a source electrode coupled to a common level. The fourth NMOS transistor comprises a drain electrode coupled to the drain electrode of the third PMOS transistor, a gate electrode for receiving the third bias voltage and a source electrode coupled to the common level.

The present invention overcomes a prejudice held by those of ordinary skill in the art for long in designing low frequency analog devices, and particularly, the present invention operates at least one MOS transistor at a weak inversion region. According to an embodiment of the present invention, a low frequency analog circuit structure may have a high power efficiency and a low noise is provided for a capacitance type microphone.

BRIEF DESCRIPTION OF THE DRAWINGS

The accompanying drawings are included to provide a further understanding of the invention, and are incorporated

DESCRIPTION OF THE EMBODIMENTS

Reference will now be made in detail to the embodiments of the invention, examples of which are illustrated in the accompanying drawings. Wherever possible, the same reference numbers are used in the drawings and the description to refer to the same or like parts.

For convenience of illustration, NMOS transistors are exemplified in accordance with the embodiments of the present invention without limiting the scope of the invention as such.

When a NMOS transistor is operated under a condition of "$V_{gs}-V_{th}<0$", the NMOS transistor is therefore operated at a weak inversion region. An operation of the NMOS transistor is similar with that of an NPN bipolar junction transistor, in which a source electrode of the NMOS transistor is operated like an emitter of the NPN bipolar junction transistor; a substrate of the NMOS transistor is operated like a base of the NPN bipolar junction transistor; and a drain electrode of the NMOS transistor is operated like a collector of the NPN bipolar junction transistor. When the NMOS transistor is further operated under a condition of "$V_{gs}-V_{th}<-100$ mV", the NMOS transistor is then operated at a deep sub-threshold region, that is definitely also operated at the weak inversion region. Further, as the NMOS transistor is operated at the weak inversion region, a drain current of the MOS transistor is determined by a diffusion current defined as equation (4):

$$I_D = I_{D0}(W/L)e^{(V_{gs}/nVt)}, \quad (4)$$

wherein W and L represent a width and a length of the MOS transistor respectively; $n=(C_{js}+C_{ox})/C_{ox}$, in which Cox represents an oxidation capacitance, $C_{js}$ represents a depletion region capacitance; $V_t=kT/q$; and $I_{D0}$ can be obtained from experimental data. A transconductance $\partial I_D/\partial V_{gs}$ of the MOS transistor when operated at the weak inversion region and the saturation region can be described by equation (5) and equation (6) respectively as:

$$g_m = qI_D/nkT; \quad (5)$$

$$g_m = \sqrt{2K(W/L)I_D}. \quad (6)$$

It can be obtained from the forgoing equations (5) and (6) that when the transistor is operated at a weak inversion region, a larger transconductance can be obtained. Considering that the transconductance affects a gain of the circuit and a noise performance thereof, when the transconductance is adjusted to be relatively large, and the current is adjusted to be relatively small, a circuit featured with lower power consumption and lower noise can be obtained.

According to the above teachings, the present invention provides a low frequency analog circuit with low power consumption and low noise, which is adapted for reading and amplifying an output of a condenser microelectromechanical system (MEMS) microphone. A typical condenser MEMS microphone usually does not contain any electret material, and therefore when operating such a microphone, an external bias voltage is required for operation. Generally, the bias voltage is often demanded to be higher than 12V. As such, the combination of the condenser MEMS microphone and a low frequency analog circuit often causes a higher power consumption. Thus, the low frequency analog circuit according to the present invention can be used for processing post signals of the condenser MEMS microphone. Prior to discussing the low frequency analog circuit in details, there is a need to discuss a relationship between the transconductance and the noise. As previously introduced, equation (3), i.e., $V_i^2/\Delta f=(8/3)kT(1/g_m)+K_f/WLC_{ox}f$, defines the noise of the MOS transistor, which includes thermal noise and flicker noise. Because the transistor operated at the weak inversion region corresponds to a larger transconductance, the thermal noise performs less affection on a noise spectral density than a situation when the transistor is operated at the saturation region, as concluded from equation (3) that the transconductance $g_m$ is inversely proportional to the noise density. Further, a flicker noise coefficient $K_f$ corresponding to the weak inversion region is also smaller than that corresponding to the saturation region.

The equation (3) concerns a single transistor. However, an applicable low frequency analog circuit requires a plurality of transistors serving different functions. As discussed, by associating with the equation (3), if a low frequency analog circuit can be concluded as applicable for a handheld MEMS microphone featured with a lower power consumption, the low frequency analog circuit can be designed to be a negative feedback circuit.

Figure 1:
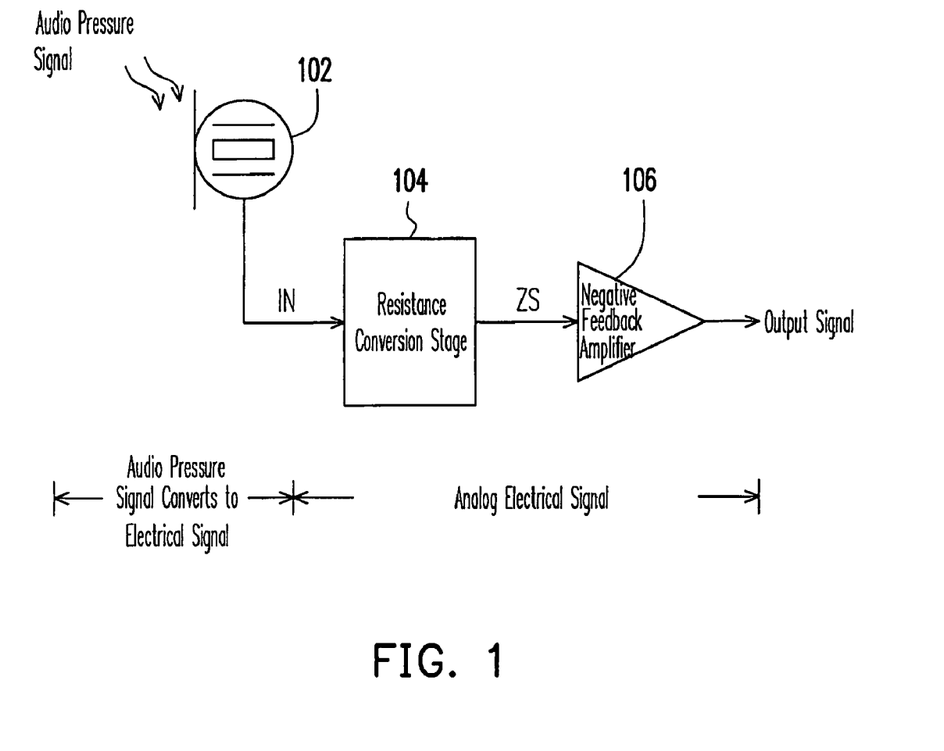
FIG. 1 is diagram illustrating a coupling structure between a microphone and a negative feedback circuit.

FIG. 1 is diagram illustrating a coupling structure between a microphone and a negative feedback circuit. Referring to FIG. 1, the negative feedback circuit includes a resistance conversion stage 104 and a two-stage negative feedback amplifier 106. The resistance conversion stage 104 is adapted for receiving an output from a MEMS microphone 102. The resistance conversion stage 104 is employed for converting a high resistance initiated by a small sensing capacitor of the MEMS microphone 102 into a low resistance when the MOS transistor is in a proper scale. The two-stage negative feedback amplifier 106 is adapted for providing a gain of about 20 dB to a small input signal. A circuit and a bias stage of the entire transistor will be disclosed as shown in FIG. 2.

Figure 2:
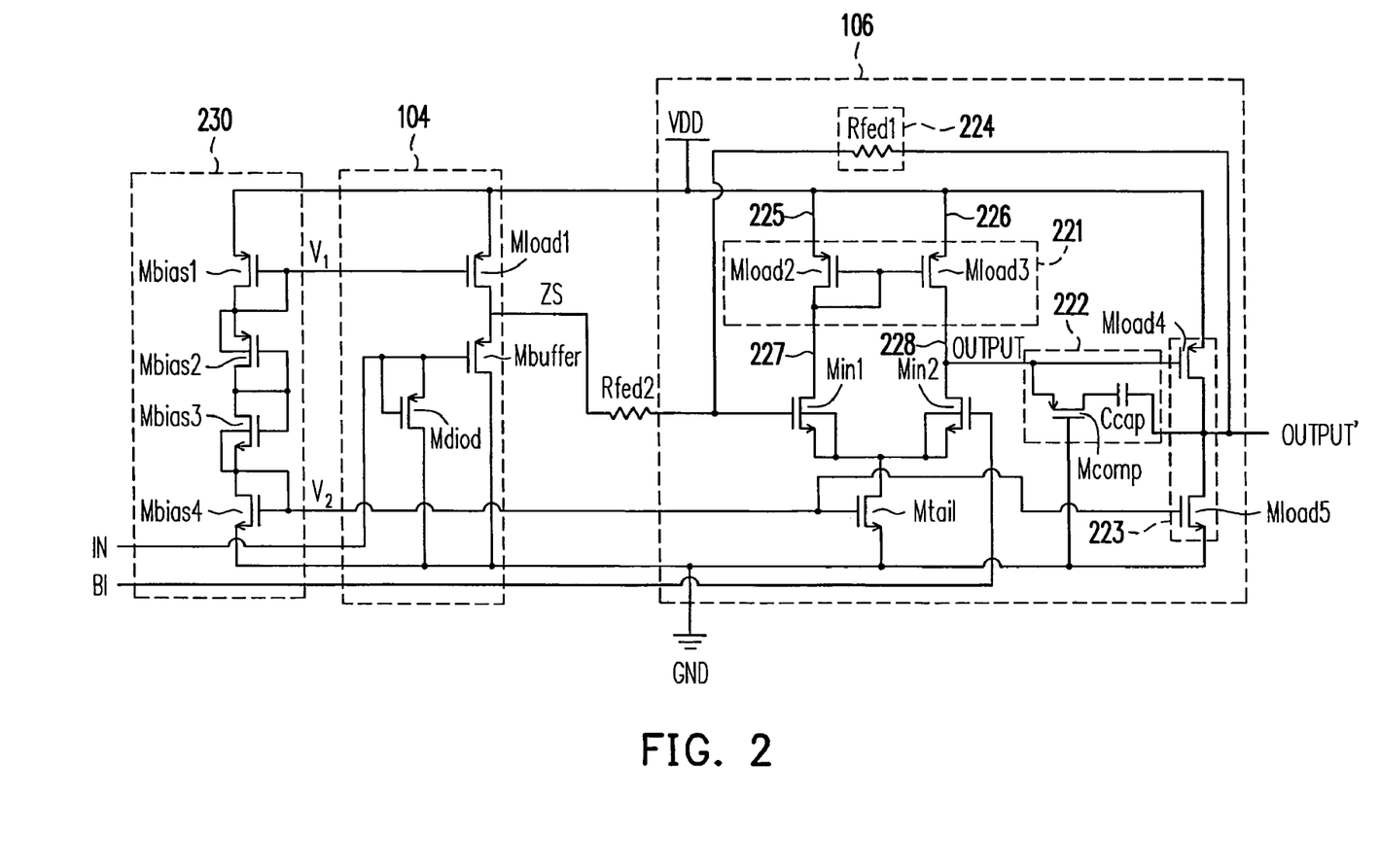
FIG. 2 is a circuit diagram of a low frequency analog circuit according to an embodiment of the present invention.
Figure 3:
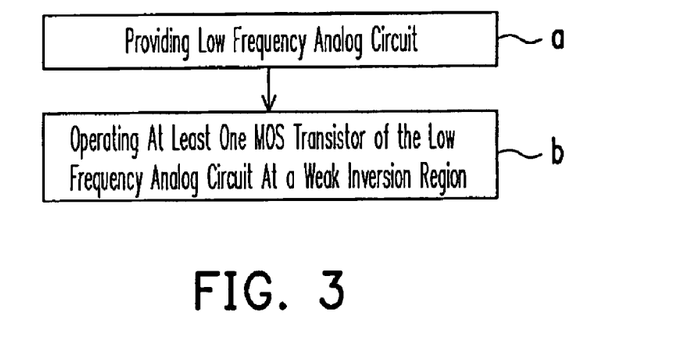
FIG. 3 is a flow chart illustrating a method of designing a low frequency analog circuit according to an embodiment of the present invention.

FIG. 2 is a circuit diagram of a low frequency analog circuit according to an embodiment of the present invention, and FIG. 3 is a flow chart illustrating a method for designing a low frequency analog circuit according to an embodiment of the present invention. Referring to FIGS. 2 and 3, the low frequency analog circuit provided by step "a" of the present embodiment is designed with a negative feedback type, in which a power source voltage VDD serves as an operation voltage thereof and a ground voltage GND serves as a common level. The low frequency analog circuit includes a resistance conversion stage 104 and an amplifying circuit 106. The resistance conversion stage 104 is adapted for receiving an input signal IN, i.e., an output of the microphone 102, and converting the input signal IN from a high resistance to a low resistance, and thus forming a resistance conversion signal ZS. The amplifying circuit 106 is adapted for receiving the resistance conversion signal ZS. In the present embodiment, the resistance conversion stage 104 is configured with PMOS transistors Mdiod, Mload1, and Mbuffer. Gate electrodes of the PMOS transistors Mdiod and Mbuffer receive the input signal IN. The resistance conversion signal ZS is outputted from a source electrode of the PMOS transistor Mbuffer. The PMOS transistor Mdiod is a transistor having a relatively large resistance unit, so that the PMOS transistor Mdiod together with the MEMS microphone comprises a low pass filter for transmitting an audio signal, e.g., the foregoing input signal IN. The audio signal is transmitted to the amplifying circuit 106 via the PMOS transistor Mbuffer. The PMOS transistor Mbuffer is a source follower, which is capable of transmitting the input signal IN from a high resistance to a low resistance, and therefore transmitting to the amplifying circuit 106.

The foregoing amplifying circuit 106 is equivalent to the two-stage negative feedback amplifier 106, which is a microphone sensing circuit. The amplifying circuit 106 includes a resistor Rfed2, a current mirroring device 221, a compensation circuit 222, an output buffer circuit 223, a feedback circuit 224, and three NMOS transistors, Min1, Min2, and Mtail.

The current mirroring device 221 includes a first terminal 225, a second terminal 226, a third terminal 227 and a fourth terminal 228. The current mirroring device 221 determines the current values of the second terminal 226 and the fourth terminal 228 according to the current flowing through the first terminal 225 and the third terminal 227. Gate electrodes of the NMOS transistors Min1, Min2 respectively serve as a negative output terminal and a positive output terminal of the amplifying circuit 106. A drain electrode of the NMOS transistor Min2 outputs an output signal OUTPUT. The compensation circuit 222 is adapted for compensating the output signal OUTPUT. The output buffer circuit 223 is adapted for receiving and amplifying the output signal OUTPUT so as to provide the output signal OUTPUT to a post stage circuit of the low frequency analog circuit. The feedback circuit 224 is employed for limiting the gain of the amplifying circuit 106.

In the present embodiment, the resistance Rfed2 is realized with a resistor, and the feedback circuit 224 takes the resistance Rfed1 as a feedback resistance between the output terminal and the negative input terminal of the amplifying circuit 106. An amplifying ratio of the amplifying circuit 106 is determined by resistance values of the resistance Rfed2 and the feedback circuit 224. Further, the current mirroring device 221 is realized with PMOS transistors Mload2 and Mload3. The compensation circuit 222 is realized with PMOS transistors Mcomp and resistance Ccap. The resistance Ccap according to an aspect of the embodiment is a capacitor. The output buffer circuit 223 is realized with a PMOS transistor Mload4 and an NMOS transistor Mload5. A drain electrode of the NMOS transistor Mload5 serves as an output terminal of the low frequency analog circuit. Because the structure of the amplifying circuit 106 is a negative feedback circuit, signals outputted from the low frequency analog circuit are stable.

Moreover, a bias stage 230 comprised of PMOS transistors Mbias1, Mbias2, and NMOS transistors Mbias3, Mbias4, provides bias voltages to the resistance conversion stage 104 and the amplifying circuit 106 for operation. In the present embodiment, the bias stage 230 outputs a first bias voltage V1 from a gate electrode of the PMOS transistor Mbias1 to a gate electrode of the PMOS transistor Mload1, and outputs a second bias voltage V2 from a gate electrode of the NMOS transistor Mbias 4 to a gate electrode of the NMOS transistor Mtail.

In accordance with the present invention, components which are highly related to cause a high noise and a high power consumption are selected. Taking the circuit illustrated by FIG. 2 as an example, in a simulation process, all MOS transistors in the circuit are operated at a strong inversion region, and satisfy the circuit according to expected requirements. Then, key components highly related to cause the high noise and the high power consumption are determined. For example, NMOS transistors Min1 and Min2 are such key components shown in FIG. 2. Then the key components are selected to be operated at the weak inversion region or the deep sub-threshold region, so as to lower the noise and the power consumption. Those of ordinary skill in the art would be aware of techniques to operate or bias the transistors Min1 and Min2 at the weak inversion region. For example, adjusting the sizes of some transistors of FIG. 2 is a technique of obtaining a different bias voltage. Practically, the NMOS transistor Min1 can be switched to be operated at the weak inversion region or the deep sub-threshold region by adjusting the sizes of the MOS transistors Mbias1, Mload1 of the current mirroring device, sizes of the MOS transistors Min1 and Min2 of an input pair, and resistance values of the resistance Rfed2 and the feedback circuit 224. In general, an operation voltage of the gate of the NMOS transistor Min1 is adjusted to be lower than a sum of a threshold voltage and a source voltage of the NMOS transistor Min1. Further, a reference bias voltage BI is provided to the gate electrode of the MOS transistor Min2. The reference bias voltage BI is lower than a sum of a threshold voltage and a source voltage of the MOS transistor Min2, so that the transistor Min2 can also be operated at the weak inversion region. This is a step "b" as shown in FIG. 3.

It should be further noted that in order to allow NMOS transistors Min1 and Min2 capable of operating at the weak inversion region, or even at the deep sub-threshold region, both of the NMOS transistors Min1 and Min2 should satisfy the condition of "$V_{gs}-V_{th}<0$", preferably "$V_{gs}-V_{th}<-100$ mV". Similarly, if PMOS transistors are alternatively selected instead of NMOS transistors, then the PMOS transistors should satisfy a condition of "$V_{sg}-V_{th}<0$", preferably "$V_{sg}-V_{th}<0$". In above conditions, $V_{gs}$ represents a voltage between a gate electrode and a source electrode of the NMOS transistor, and $V_{sg}$ represents a voltage between a gate electrode and a source electrode of the PMOS transistor, and $V_{th}$ represents a threshold of the MOS transistor.

Figure 4:
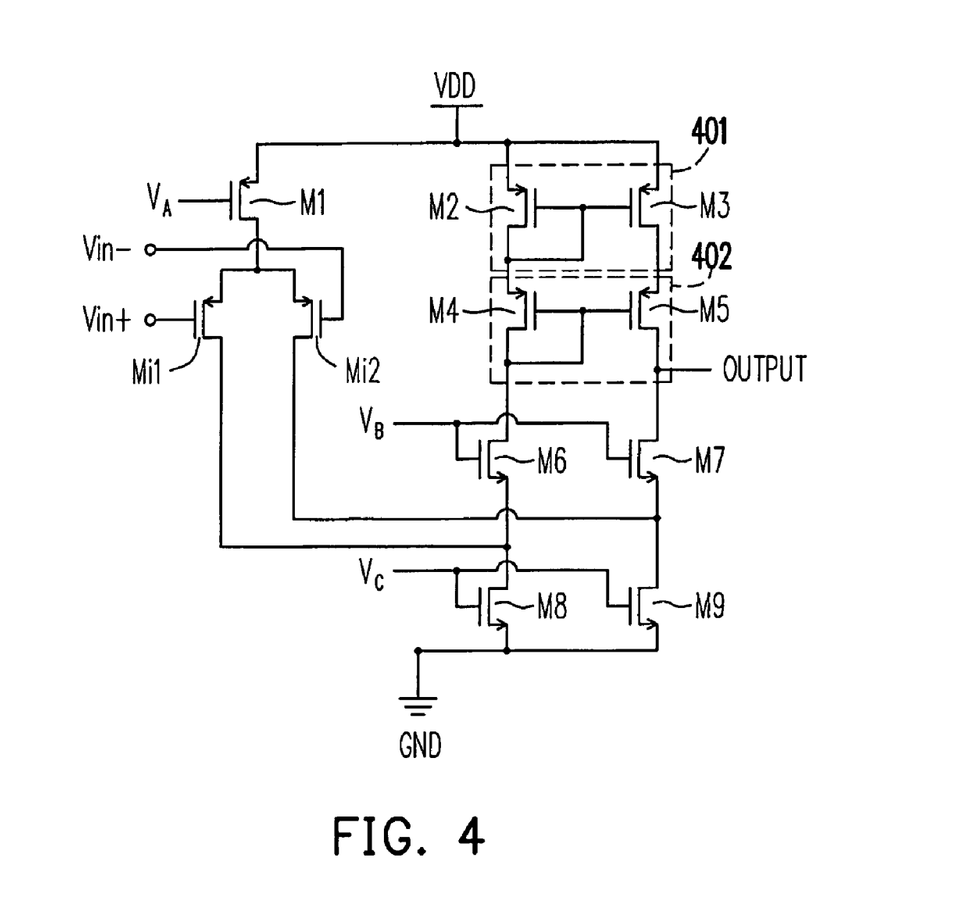
FIG. 4 is a circuit diagram of a low frequency analog circuit according to another embodiment of the present invention.

FIG. 4 is a circuit diagram of a low frequency analog circuit according to another embodiment of the present invention. FIG. 4 shows a folded cascade circuit adapted for a low frequency application such as the step "a" as shown in FIG. 3. Referring to FIGS. 3 and 4, the low frequency analog circuit of FIG. 4 includes PMOS transistors M1, Mi1, and Mi2, and current mirroring devices 401, 402, and NMOS transistors M6~M9. The current mirroring device 401 includes PMOS transistors M2 and M3. The current mirroring device 402 includes PMOS transistors M4 and M5. The coupling of the components is illustrated as shown in FIG. 4. Further, in the circuit as shown in FIG. 4, $V_{in+}$ and $V_{in-}$ represent respectively a positive input terminal and a negative input terminal of the low frequency analog circuit; $V_A$, $V_B$, and $V_C$ represent bias voltages; and OUTPUT represents an output signal thereof. For the purpose of having a high SNR and a low power consumption, components which are highly related to cause a high noise and a high power consumption are selected. In a simulation process, all transistors in the circuit are operated at a strong inversion region, and the circuit is satisfied according to expected requirements. Then, key components highly related to cause the high noise and the high power consumption are found out. For example, PMOS transistors Mi1 and Mi2 are such key components hereby.

Then the key components are selected to be operated at the weak inversion region or the deep sub-threshold region, so as to lower the noise and the power consumption. For example, the two transistors can be operated at the weak inversion region, e.g., the step "b" as shown in FIG. 3, by adjusting gate bias of these two transistors or sizes of these two transistors. Those of ordinary skill in the art would understand that because the current mirroring devices 401 and 402 are serially connected, in case of only one current mirroring device being used, the present invention is still applicable.

Now referring to FIG. 2, the circuit shown therein is regulated as: an input-referred noise <100nV/sqrtHz, a unity-gain frequency>1 MHz, a phase margin is within a range of 60 degree to 90 degree, and the power consumption <0.1 mV. When all transistors of FIG. 2 are operated at the strong inversion region and the saturation region, the input transistors Min1 and Min2 are key components causing the input-referred noise.

In order to reduce the foregoing noise, result obtained from the equation (3) can be utilized, in which the input pair, i.e., transistors Min1 and Min 2 of FIG. 2, are operated at the weak inversion region, or even the deep sub-threshold region. The input-referred noise is conducted as following. When the amplifying circuit is disconnected, a first stage noise can be describes as:

$$\overline{v^2_{in1}} = \overline{v^2_{Min1}} + \overline{v^2_{Min2}} + (g_{m\_Mload3}/g_{m\_Min1})^2 (\overline{v^2_{Mload2}} + \overline{v^2_{Mload3}}) \quad (7),$$

wherein $V_{Min1}$ represents a voltage of the transistor Min1; $g_{m\_Mload3}$ represents a transconductance of the transistor Mload3, and wherein other equations below and other representations can be understood similarly, and are not to be iterated hereby. The second stage noise can be described as:

$$\overline{v^2_{out}} = [g_{m\_Mload4}(r_{oMload4} \| r_{oMload5})]^2$$
$$\overline{v^2_{Mload4}} + [g_{m\_Mload5}(r_{oMload4} \| r_{oMload5})]^2 \overline{v^2_{Mload5}} \quad (8)$$

$$\overline{v^2_{in2}} = \overline{v^2_{Mload4}} + (g_{m\_Mload5}/g_{m\_Mload4})^2 \overline{v^2_{Mload5}} \quad (9)$$

the noise from the second stage to the first stage can be described as:

$$\overline{v^2_{in2 \to in1}} = (\overline{v^2_{Mload4}} + (g_{m\_Mload5}/g_{m\_Mload4})^2$$
$$\overline{v^2_{Mload5}})/[g_{m\_Min1}(r_{oMin2} \| r_{oMload3})]^2 \quad (10)$$

the input noise can be described as:

$$\overline{v^2_{in\_noise\_total}} = \overline{v^2_{in1}} + \overline{v^2_{in2 \to in1}} \quad (11)$$

therefore, the total input noise is defined as:

$$(R_{fed1}/R_{fed2})^2 \overline{v^2_{out}} + (\overline{v^2_{in\_noise\_total}}(1 + (R_{fed1}/R_{fed2}))^2) +$$
$$\overline{v^2_{thermalRfed2}} + \overline{v^2_{Mdiod}} + (g_{mMload1} r_{oMload1})^2$$
$$\overline{v^2_{Mload1}} \quad (12)$$

Figure 5:
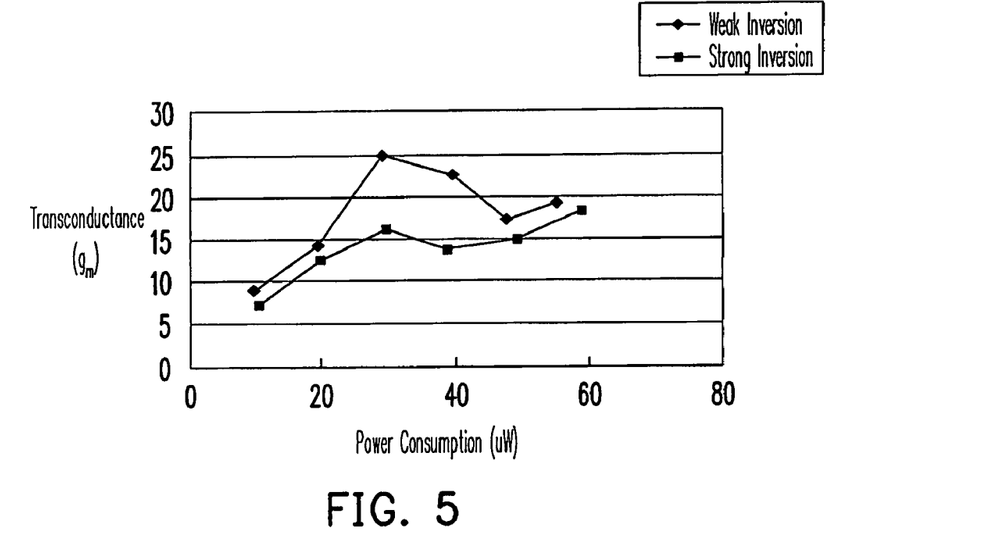
FIGS. 5, 6, 7 are simulation results of the low frequency analog circuit of FIG. 2.
Figure 6:
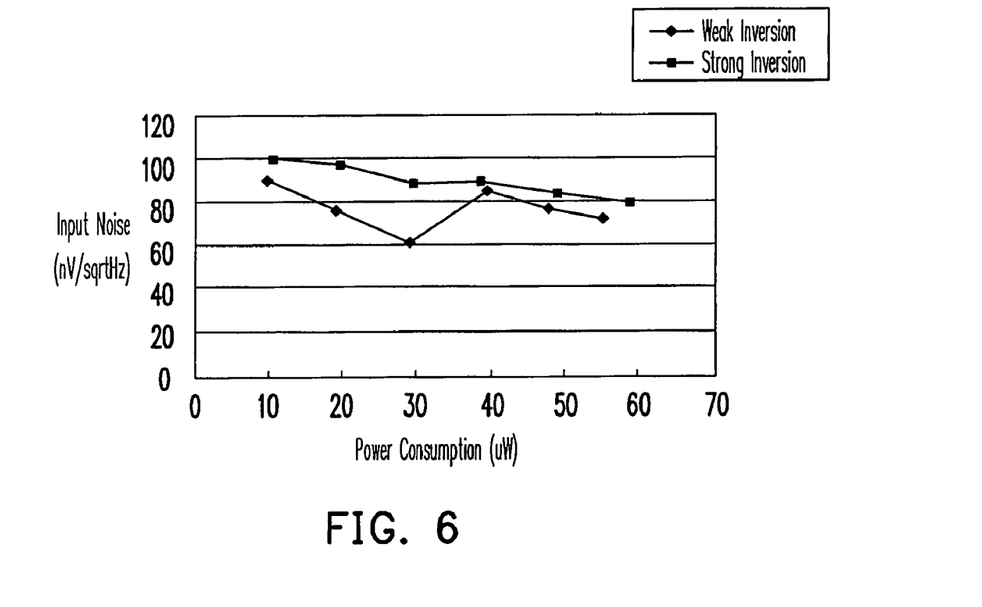

A noise of a transistor operated at the weak inversion region can be obtained by calculating the equation (3) according to the equation (5). A total circuit noise can be obtained when all transistors thereof are operated at the weak inversion region by calculating the equation (12) according to the equation (11). According to an aspect of the instant embodiment of present invention, the circuit is fabricated according to a predetermined size requirement for complying with a 0.35 µm CMOS regulation as set by Taiwan semiconductor manufacturing company Ltd. (TSMC) and featured with a total power consumption in the range of 10 µW to 60 µW. FIGS. 5 and 6 are simulation results respectively in different power limitations. It can be learnt from FIG. 5, that a transconductance of input pair operated at the weak inversion region is greater than a transconductance of input pair operated at a strong inversion region. When the power consumption is decreased, the transconductance is correspondingly decreased. It can also be learnt from the equations (3) and (12) that when the transconductance $g_m$ decreases, the thermal noise in the circuit increases, and the total noise composed of the thermal noise and the flicker noise also increases as shown in FIG. 6.

Figure 7:
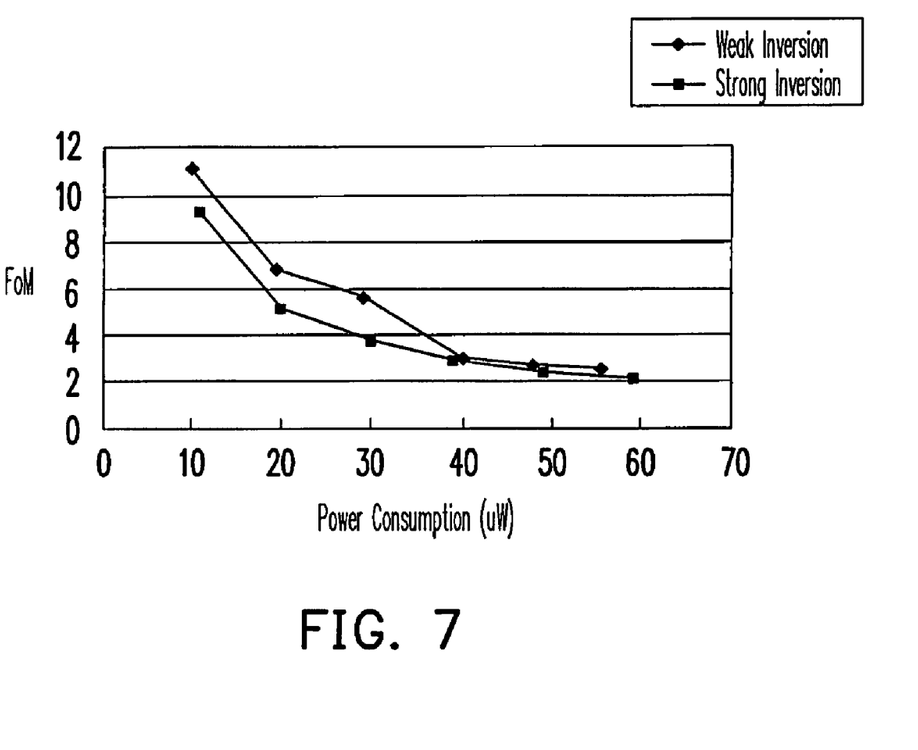

For achieving an object of the present invention to achieve lower power consumption and lower noise, a symbol parameter FoM is defined for reference. As shown in equation (13), the reference parameter contains the foregoing parameters. A definite objective for a MEMS microphone is to achieve such a symbol parameter FoM as large as possible.

$$FoM = 1/((\text{input\_referred\_noise})(\text{power\_consumption})) \quad (13),$$

wherein input_referred_noise represents the input-referred noise, and power_consumption represents the power consumption. In fact, the input-referred noise is relative to a gain coefficient thereof. FIG. 7 describes a corresponding relationship between the symbol parameter and the power consumption. As shown in FIG. 7, when the power consumption is limited under 30 µW, and the transistor is operated at the weak inversion region, the symbol parameter is improved up to 48%. When the power consumption is limited under 20 µW and 10 µW respectively, the symbol parameter is improved up to 33% and 20% correspondingly.

Although the foregoing embodiments provides a plurality of approaches to carry out the present invention, it should be understood that different manufacturers design low frequency analog circuits in different ways, and if only at least one MOS transistor is operated at a weak inversion region, the low frequency analog circuit is construed to be within the scope of the present invention.

Further, the low frequency analog circuit is adapted for operating under 1 MHz, which is adapted for processing audio signals. Therefore, the low frequency analog circuit is suitable for operating with a MEMS microphone. A sensing component of such a microphone is usually operated at a low frequency, and requires low noise and low power consumption, such as a hearing aid or a mobile equipment. In such a manner, the present invention is well adapted.

In summary, the present invention overcomes a prejudice held by those of ordinary skill in the art for long in designing low frequency analog devices, and particularly, the present invention operates at least one MOS transistor at a weak inversion region. According to an embodiment of the present invention, a low frequency analog circuit structure having a high power efficiency and a low noise is provided for a capacitance type microphone. Operating the MOS transistors at the weak inversion region, or even at a deep sub-threshold region, better performance can be obtained by an amplifying circuit using the same for sensing audio signals, so as to realize unpredictable result to those of ordinary skill in the art. As simulated, a low power consumption and a high symbol parameter FoM may be obtained by the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low frequency analog circuit, comprising:
   a resistance conversion stage, for receiving an input signal and transmitting the input signal from a high resistance to a low resistance, so as to form a resistance conversion signal; and
   an amplifying circuit, for receiving and amplifying the resistance conversion signal, wherein the amplifying circuit comprises at least one MOS transistor, highly related to cause high noise and high power consumption, operating at a weak inversion region,
   wherein the resistance conversion stage comprises:
      a first PMOS transistor, having a source electrode and a gate electrode receiving the input signal and a drain electrode coupled to a grounded voltage;
      a second PMOS transistor, having a source electrode coupled to a power source voltage, and a gate electrode for receiving a first bias voltage; and
      a third PMOS transistor, having a drain electrode coupled to the grounded voltage, and a gate electrode coupled to the source electrode of the first PMOS transistor, and a source electrode coupled to a drain electrode of the second PMOS transistor, and outputting the resistance conversion signal.

2. The low frequency analog circuit according to claim 1, wherein the amplifying circuit comprises:
   a current mirroring device, comprising a first terminal, a second terminal, a third terminal, and a fourth terminal, wherein the first terminal and the second terminal are coupled to a power source voltage, and the current mirror device determines values of currents flowing through the second terminal and the fourth terminal according to the currents flowing through the first terminal and the third terminal;
   a first NMOS transistor, having a gate electrode receiving the resistance conversion signal, a body connected to a source electrode thereof, and a drain electrode coupled the third terminal of the current mirroring device, wherein the first NMOS transistor is operated at a weak inversion region;
   a second NMOS transistor, having a gate electrode for receiving a reference bias voltage, a body coupled to a source electrode thereof, a drain electrode coupled to the fourth terminal of the current mirroring device and outputting an output signal, wherein the source electrode of the second NMOS transistor is coupled to the source electrode of the first NMOS transistor, and the reference bias voltage is less than a sum of a threshold voltage of the second NMOS transistor and a source voltage of the second NMOS transistor; and
   a third NMOS transistor, having a source voltage coupled to the grounded voltage, a drain electrode coupled to the source voltage of the second NMOS transistor, and a gate electrode for receiving a second bias voltage.

3. The low frequency analog circuit according to claim 2, wherein the current mirroring device further comprises:
   a fourth PMOS transistor, having a source electrode and a drain electrode serving as the first terminal and the third terminal of the current mirroring device respectively, and a gate electrode coupled to the drain electrode of the fourth PMOS transistor; and
   a fifth PMOS transistor, having a source electrode and a drain electrode serving as the second terminal and the fourth terminal of the current mirroring device respectively, wherein a gate electrode of the fifth PMOS transistor is coupled to the gate electrode of the fourth PMOS transistor.

4. The low frequency analog circuit according to claim 2, wherein the amplifying circuit further comprises an output buffer circuit for receiving and amplifying the output signal.

5. The low frequency analog circuit according to claim 4, wherein the output buffer circuit further comprises:
   a sixth PMOS transistor, having a source electrode coupled to the power source voltage, and a gate electrode for receiving the output signal; and
   a fourth NMOS transistor, having a source electrode coupled to the grounded voltage, a gate electrode coupled to the gate electrode of the third NMOS transistor, and a drain electrode coupled to a drain electrode of the sixth PMOS transistor, and serving as an output terminal of the low frequency analog circuit.

6. The low frequency analog circuit according to claim 5, wherein amplifying circuit further comprises a feedback circuit coupled between the drain electrode of the fourth NMOS transistor and the gate electrode of the first NMOS transistor for limiting a gain of the amplifying circuit.

7. The low frequency analog circuit according to claim 6, wherein the feedback circuit comprises:
   a first resistance having a first end coupled to the drain electrode of the fourth NMOS transistor, and a second end coupled to the gate electrode of the first NMOS transistor.

8. The low frequency analog circuit according to claim 7, wherein the first resistance comprises a resistor.

9. The low frequency analog circuit according to claim 5, wherein the amplifying circuit further comprises a compensation circuit coupled between the drain electrode of the second NMOS transistor, the gate electrode of the sixth PMOS transistor, and the drain electrode of the fourth NMOS transistor for compensating the output signal.

10. The low frequency analog circuit according to claim 9, wherein the compensation circuit comprises:
    a seventh PMOS transistor, having a gate electrode coupled to the grounded voltage, a source electrode coupled to the drain electrode of the second NMOS transistor and the gate electrode of the sixth PMOS transistor; and
    a second resistance, having a first end coupled to a drain electrode of the seventh PMOS transistor, and a second end coupled to the drain electrode of the fourth NMOS transistor.

11. The low frequency analog circuit according to claim 10, wherein the second resistance comprises a capacitor.

12. The low frequency analog circuit according to claim 9, wherein the amplifying circuit further comprises a third resistance having a first end coupled to the gate electrode of the first NMOS transistor, and a second end for receiving the resistance conversion signal.

13. The low frequency analog circuit according to claim 12, wherein the third resistance comprises a resistor.

14. The low frequency analog circuit according to claim 2, wherein the low frequency analog circuit further comprises a bias voltage stage coupled to the resistance conversion stage and the amplifying circuit for providing the first bias voltage and the second bias voltage.

15. The low frequency analog circuit according to claim 14, wherein the bias voltage stage comprises:
    an eighth PMOS transistor having a source electrode coupled to the power source voltage, a gate electrode and a drain electrode coupled one to another, wherein the gate electrode of the eighth PMOS transistor outputs the first bias voltage;

a ninth PMOS transistor having a gate electrode and a drain electrode coupled one to another, and a source electrode coupled to a body of the ninth PMOS transistor and the drain electrode of the eighth PMOS transistor;

a fifth NMOS transistor having a source electrode coupled to a body thereof, a gate electrode coupled to the gate electrode of the ninth PMOS transistor, and a drain electrode coupled to the drain electrode of the ninth PMOS transistor; and a sixth NMOS transistor having a gate electrode and a drain electrode coupled one to another, and a source electrode coupled to the grounded voltage, wherein the drain electrode of the sixth NMOS transistor is coupled to the source electrode of the fifth NMOS transistor, and the gate electrode of the sixth NMOS transistor outputs the second bias voltage.

16. The low frequency analog circuit according to claim 2, wherein the first NMOS transistor is operated satisfying a condition of $V_{gs}-V_{th}21 -100$ mV, wherein $V_{gs}$ is a voltage between a gate electrode and a source electrode of the NMOS transistor; and $V_{th}$ is a threshold voltage of the MOS transistor.

17. The low frequency analog circuit according to claim 2, wherein the reference bias voltage controls the second NMOS transistor being operated satisfying a condition of $V_{gs}-V_{th}<-100$ mV, wherein $V_{gs}$ is a voltage between a gate electrode and a source electrode of the NMOS transistor; and $V_{th}$ is a threshold voltage of the MOS transistor.

18. The low frequency analog circuit according to claim 1, wherein the low frequency analog circuit is operated at a frequency lower than 1 MHz.

19. The low frequency analog circuit according to claim 1, wherein the output signal is an output of a condenser microphone.

20. A low frequency analog circuit, comprising:

a first PMOS transistor, having a source electrode coupled to a power source voltage, and a gate electrode receiving a first bias voltage;

a second PMOS transistor, having a source electrode coupled to a drain electrode of the first PMOS transistor, a gate receiving a first input signal, wherein the second PMOS transistor is highly related to cause high noise and high power consumption and operated at a weak inversion region;

a third PMOS transistor, having a source electrode coupled to the drain electrode of the first PMOS transistor, a gate receiving a second input signal, wherein the second input signal and the first input signal are differential signals, and the third PMOS transistor is highly related to cause high noise and high power consumption and operated at the weak inversion region;

a first current mirroring device, comprising a first terminal, a second terminal, a third terminal, and a fourth terminal, wherein the first terminal and the second terminal are coupled to the power source voltage, and the first current mirror device determines values of currents flowing through the second terminal and the fourth terminal according to the currents flowing through the first terminal and the third terminal;

a first NMOS transistor, having a drain electrode coupled the third terminal of the current mirroring device, a gate electrode receiving a second bias voltage, and a source electrode coupled to a drain electrode of the second PMOS transistor;

a second NMOS transistor, having a drain electrode coupled to the fourth terminal of the current mirroring device and serving as an output terminal of the low frequency analog circuit, a gate electrode receiving the second bias voltage, and a source electrode coupled to the drain electrode of the third PMOS transistor;

a third NMOS transistor, having a drain electrode coupled to the drain electrode of the second PMOS transistor, a gate electrode receiving a third bias voltage, and a source electrode coupled to a common electrode; and a fourth NMOS transistor, having a drain electrode coupled to the drain electrode of the third PMOS transistor, a gate electrode receiving the third bias voltage, and a source electrode coupled to the common level, wherein the first PMOS transistor and the first through the fourth NMOS transistors are not highly related to cause high noise and high power consumption in the low frequency analog circuit, and operated at a strong inversion region.

21. The low frequency analog circuit according to claim 20, wherein the first current mirroring device comprises:

a fourth PMOS transistor, having a source electrode and a drain electrode serving respectively as the first terminal and the third terminal of the first current mirroring device, wherein a gate electrode of the fourth PMOS transistor is coupled to the drain electrode of the fourth PMOS transistor; and a fifth PMOS transistor, having a source electrode and a drain electrode serving respectively as the second terminal and the fourth terminal of the first current mirroring device, wherein a gate electrode of the fifth PMOS transistor is coupled to the gate electrode of the fourth PMOS transistor.

22. The low frequency analog circuit according to claim 20, further comprising a second current mirroring device coupled between the first current mirroring device, the first NMOS transistor and the second NMOS transistor;

wherein the second current mirroring device comprises a first terminal, a second terminal, a third terminal, and a fourth terminal, wherein the first terminal and the second terminal of the second current mirroring device are coupled to the third terminal and the fourth terminal of the first current mirroring device respectively; the third terminal and the fourth terminal of the second current mirroring device are coupled to the drain electrode of the first NMOS transistor and the drain electrode of the second NMOS transistor respectively; and the second current mirror device determines values of currents flowing through the second terminal and the fourth terminal thereof according to the currents flowing through the first terminal and the third terminal thereof.

23. The low frequency analog circuit according to claim 22, wherein the second current mirroring device comprises:

a sixth PMOS transistor, having a source electrode and a drain electrode serving respectively as the first terminal and the third terminal of the second current mirroring device, wherein a gate electrode and a drain electrode thereof are coupled one to another; and a seventh PMOS transistor, having a source electrode and a drain electrode serving respectively as the second terminal and the fourth terminal of the second current mirroring device, wherein a gate electrode of the seventh PMOS transistor is coupled to the gate electrode of the sixth PMOS transistor.

* * * * *